United States Patent
Pagliato et al.

(10) Patent No.: US 7,136,305 B2
(45) Date of Patent: Nov. 14, 2006

(54) SENSE AMPLIFIER WITH EQUALIZER

(75) Inventors: Mauro Pagliato, Bollate (IT); Massimo Montanaro, Pavia (IT); Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/913,788

(22) Filed: Aug. 6, 2004

(65) Prior Publication Data

US 2005/0063236 A1    Mar. 24, 2005

(30) Foreign Application Priority Data

Aug. 6, 2003   (IT)   .......................... MI2003A1619

(51) Int. Cl.
G11C 16/06    (2006.01)
G11C 7/02     (2006.01)

(52) U.S. Cl. .............................. 365/185.21; 365/185.2; 365/203; 365/208

(58) Field of Classification Search ..................... None
See application file for complete search history.

(56) References Cited

U.S. PATENT DOCUMENTS

| | | | | |
|---|---|---|---|---|
| 5,148,063 A | * | 9/1992 | Hotta | 365/185.21 |
| 5,172,338 A | * | 12/1992 | Mehrotra et al. | 365/185.03 |
| 5,321,655 A | * | 6/1994 | Iwahashi et al. | 365/185.21 |
| 5,675,535 A | * | 10/1997 | Jinbo | 365/185.2 |
| 5,729,490 A | * | 3/1998 | Calligaro et al. | 365/185.03 |
| 6,044,019 A | * | 3/2000 | Cernea et al. | 365/185.21 |
| 6,301,149 B1 | * | 10/2001 | Micheloni et al. | 365/168 |
| 6,396,739 B1 | * | 5/2002 | Briner | 365/185.2 |
| 6,469,937 B1 | * | 10/2002 | Fuchigami et al. | 365/185.21 |
| 6,611,468 B1 | * | 8/2003 | Nojiri et al. | 365/207 |

* cited by examiner

*Primary Examiner*—Son Mai
(74) *Attorney, Agent, or Firm*—Lisa K. Jorgenson; Stephen Bongini; Fleit, Kain, Gibbons, Gutman, Bongini & Bianco P.L.

(57) ABSTRACT

A sense amplifier is provided that includes a measure branch receiving an input current to be detected, a reference branch receiving a reference current, and an equalizing circuit including a comparator. The equalizing circuit selectively equalizes a measure node of the measure branch with a reference node of the reference branch, and the comparator compares a voltage at the measure node of the measure branch with a voltage at the reference node of the reference branch. The equalizing circuit is such that, when activated, equalization of the measure node with the reference node is virtual and substantially does not involve a flow of current between the measure node and the reference node of the reference branch. The sense amplifier is particularly suited for reading memory cells of a semiconductor memory. Also provided is a method for sensing an input current.

21 Claims, 5 Drawing Sheets

PRIOR ART

FIG.1

PRIOR ART

FIG. 2

PRIOR ART

SENSE AMPLIFIER WITH EQUALIZER

CROSS-REFERENCE TO RELATED APPLICATIONS

This application is based upon and claims priority from Italian Patent Application No. MI2003A001619, filed Aug. 6, 2003, the entire disclosure of which is herein incorporated by reference.

FIELD OF THE INVENTION

The present invention relates to a sense amplifier for sensing currents, and in particular to a sense amplifier for reading data in semiconductor memory devices, such as non-volatile memories.

BACKGROUND OF THE INVENTION

A sense amplifier for semiconductor memory devices compares the current sunk by a selected memory cell with a reference current, typically provided by a reference cell that is structurally identical to the memory cell. A current/voltage converter ("I/V converter"), typically having a pair of transistors in current-mirror configuration, transforms the two current signals into corresponding voltage signals, which are provided to a comparator. The comparator amplifies the differential voltage signal at its input and provides an output binary signal whose state corresponds to the value stored in the memory cell.

A similar sense amplifier for memory devices is, for example, described in U.S. Pat. No. 6,128,225. In this amplifier the current of the memory cell is provided to the input branch of a current mirror, in such a way as to be mirrored on the output branch connected to the reference cell.

The continuing requests for higher density memories and the industrial need for a reduction in the cost per storage bit have led to the development of techniques in which a single memory cell is adapted to store more than a single bit.

A typical non-volatile memory cell includes a MOS transistor whose threshold voltage is varied for storing the desired information, for example by injecting charges into a floating gate. Accordingly, the current sunk by the memory cells in determined biasing states varies depending on the information stored therein. In particular, for storing more than a single bit in one memory cell more than two different threshold voltage values (or levels) for the cells are provided, with each one associated with a different logic value. Such memory cells are then referred to as multilevel.

However, the constant trend toward having smaller dimension manufacturing processes determines a reduction in the current sunk by the memory cell, so the current differences to be detected become smaller and smaller (on the order of a few microamperes). Moreover, it is desired that the asynchronous access time of the multilevel memories is kept comparable with that of the bi-level memories. Thus, for reading the multilevel memory cells it is necessary to implement sense amplifiers that are more sensitive and complex.

According to a known reading technique of a multilevel memory device (called "parallel reading"), the content of the cells is read by simultaneously comparing the current of the memory cell to be read with more reference current values. Typically for those devices parallel sense amplifiers are used.

Figure 1:
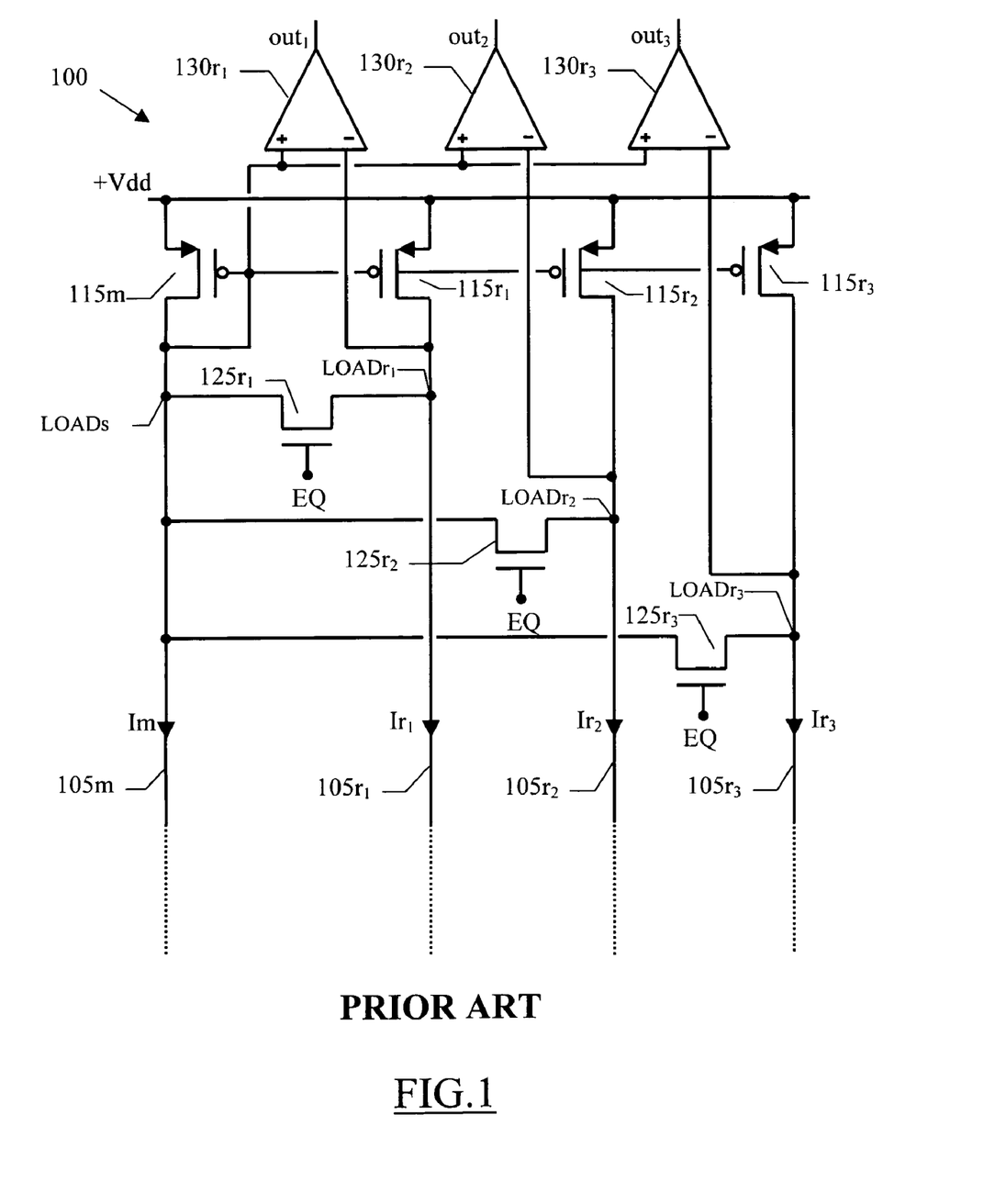
FIG. 1 shows a simplified schematic of a conventional sense amplifier for multilevel memory cells.

Referring to FIG. 1, a parallel sense amplifier 100 for quadri-level memories is schematically shown. This sense amplifier is of the type described in Italian Patent Application No. MI2003A 000075, which is in the name of the assignee of the present invention. Such a sense amplifier 100 includes a measure branch 105m for receiving the cell current Im to be measured and three reference branches 105r1–105r3, each one for receiving a reference current Ir1–Ir3, for example generated by reference cells.

The multilevel memory cell can be programmed in a plurality of states, in this example four, which are associated with corresponding ranges of the cell threshold voltage (depending on the electrical charge accumulated on the floating gate). Each programming state represents a different logic value so that the quadri-level memory cell stores a logic value which consists of two information bits $B_1B_0$ (i.e., the logic value 11, 10, 01 or 00, by the usual convention associated with increasing values of the threshold voltage).

When the selected memory cell is biased in an appropriate way, a cell current Im delivered thereby corresponds to the stored logic value. The cell current Im is read by the sense amplifier, which compares such current Im with the reference currents Ir1–Ir3 in order to decode the corresponding logic level.

Figure 2:
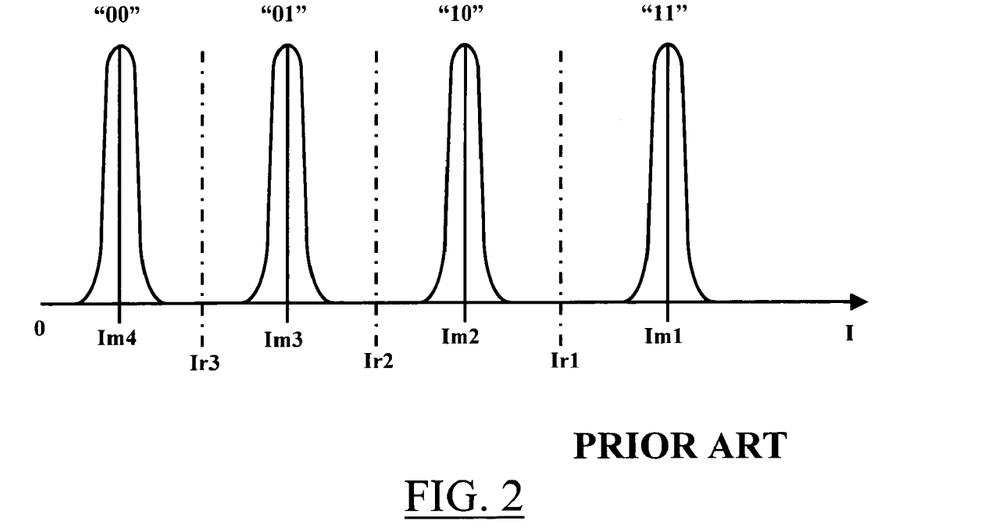
FIG. 2 is a diagram showing the relation between possible currents of a memory cell and reference currents in an exemplary case of memory cells having four levels.

FIG. 2 represents a diagram showing the relation between the cell currents and the reference currents in the case of a four-level memory. In particular, a horizontal axis I represents possible values of currents of the memory cells and the reference currents.

Im1, Im2, Im3 and Im4 represent possible values of current sunk by memory cells in each one of the four possible programming states. In detail, Im1, Im2, Im3 and Im4 are supposed to be the average values of statistical distributions of memory cell currents in the different programming states, corresponding to the logic values 11, 10, 01 and 00, respectively. In particular, under the same biasing conditions, the memory cell programmed to the logic value 11 presents a low threshold voltage so it provides a high current Im1. The current provided by the memory cells decreases with the increase of the threshold voltage, until it becomes very small (possibly zero) when the memory cell is programmed to the logic value 00.

Ir1, Ir2 and Ir3 are values of reference currents used for discriminating the four possible programming states of the quadri-level memory cells under reading conditions. Each pair of adjacent logic values is discriminated by using the reference current Iri (i=1, 2, 3); for example, the memory cell is considered to be programmed to the level 10 when its current is between the reference current Ir2 and the reference current Ir1. As described in detail below, for reading each selected memory cell a parallel sense amplifier is used, which simultaneously compares the cell current Im with the three reference currents Ir1–Ir3.

Referring back to FIG. 1, each branch 105m and 105r1–105r3 of the sense amplifier 100 includes a PMOS transistor 115m and 115r1–115r3, acting as a load. The PMOS transistor 115m of the measure branch 105m is diode-connected (i.e., the gate terminal thereof is short-circuited with the drain terminal thereof). The PMOS transistors 115m and 115r1–115r3 have their source terminals connected to a voltage supply terminal, which provides the voltage +Vdd, and their gate terminals are connected together. The drain terminals of the PMOS transistors 115m and 115r1–115r3 are referred to as "load nodes" LOADs and LOADr1–LOADr3, respectively.

An equalizing NMOS transistor 125r1–125r3 connects each reference branch 105r1–105r3 to the measure branch 105m. In particular, the equalizing transistor 125r1–125r3 has a first terminal connected to the corresponding load node LOADr1–LOADr3 and a second terminal connected to the load node LOADs. The gate terminals of the equalizing NMOS transistors 125r1–125r3 are controlled by an equalization signal EQ; in particular, the equalization signal EQ is at the logic level 0 when de-asserted and at the logic level 1 when asserted.

A comparator 130r1–130r3, consisting of a differential amplifier, is associated with each reference branch 105r1–105r3. In particular, the inverting input terminal ("–") of each comparator 130r1–130r3 is connected to the corresponding load node LOADr1–LOADr3, whereas the non-inverting input terminals ("+") of all the comparators 130r1–130r3 are connected to the load node LOADs.

In the above-described architecture of the parallel sense amplifier 100, each PMOS transistor 115r1–115r3 on the reference branches 105r1–105r3 forms a current mirror with the PMOS transistor 115m on the measure branch 105m; such current mirrors are connected in parallel to each other. Each current mirror mirrors the unknown cell current Im on the three reference currents Ir1–Ir3. The difference between the cell current Im and each one of the reference currents Ir1–Ir3 then generates a difference between the voltages at the input terminals of the corresponding comparators 130r1–130r3.

Accordingly, each comparator 130r1–130r3 amplifies the voltage difference between the load node LOADs and one of the load nodes LOADr1–LOADr3. The output terminal of each comparator 130r1–130r3 generates a comparison signal out1–out3 indicative of the result of the comparison between the currents.

When the equalization signal EQ is asserted, the equalizing transistors 125r1–125r3 are turned on and permit the pre-charge current to flow within the matrix and reference branches 105m and 105r1–105r3 and equalize the voltage at the terminals LOADs and LOADr1–LOADr3. This phase is referred to as "pre-charge/equalization phase" and has a duration such that it permits the biasing stabilization of the sense amplifier 100 and the cell current Im. Such a pre-charge/equalization phase also insures the comparator 130r1–130r3 does not wrongly amplify the pre-charge signal.

The structure just described, although satisfactory under many aspects, is however affected by a problem which will now be illustrated.

Let for example the case be considered in which the cell current Im is greater than the reference currents Ir1–Ir3 (a typical case of cells storing 11). In the pre-charge/equalization phase, the measure branch 105m is also pre-charged thanks to the current contribution coming from the load nodes LOADr1–LOADr3 of at least some of the reference branches 105r1–105r3, in particular of the branch 105r3 and, in lower amount, of the branch 105r2. The reference branch 105r1 in turn receives current contributions from the reference branch 105r3 and, in lower amount, from the reference branch 105r2. The load nodes LOADs and LOADr1–LOADr3 are then caused to assume a biasing voltage with a value different from their operating steady-state value when the equalizing transistors 125r1–125r3 are turned off. In particular, the load node LOADs is caused to assume a biasing voltage with a value higher than expected.

As a consequence, in an "evaluation phase", when the equalization signal EQ is de-asserted (i.e., the equalizing transistors 125r1–125r3 are turned off), the load nodes LOADr1–LOADr3 require a given time interval for reaching their steady-state value. Such a time interval cannot be evaluated a priori, since it depends also on the stray capacitive load at the load nodes LOADs and LOADr1–LOADr3 and on the unknown differential current signal.

Figure 3:
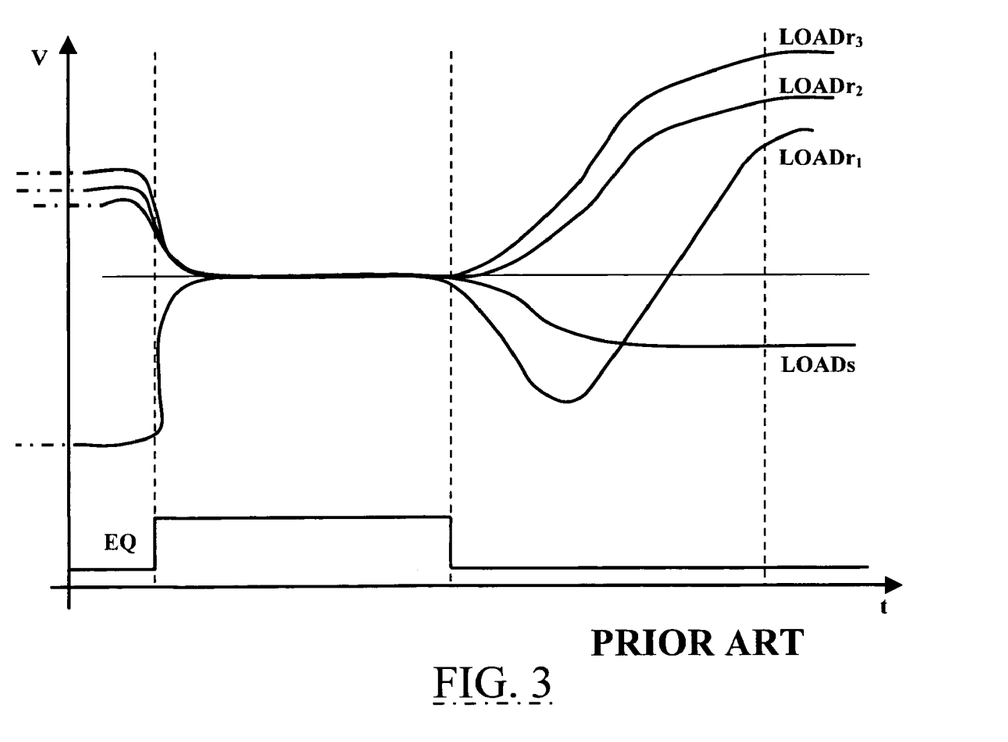
FIG. 3 shows the trend of the voltages at load nodes of the sense amplifier of FIG. 1 versus time in the case of a particular programming state of the memory cell to be read.

FIG. 3 shows a diagram of the voltages at the load nodes LOADs and LOADr1–LOADr3 versus time in the parallel sense amplifier of FIG. 1 in the above-described case, wherein the cell current Im is greater than the reference current Ir1.

During the pre-charge/equalization phase (i.e., signal EQ at logic level 1), as described above, the load node LOADs, and then the gate terminal of the PMOS transistors 115m and 115r1–115r3, are brought towards a voltage greater than the steady-state one.

In the successive evaluation phase (i.e., signal EQ at logic level 0), the diode-connected PMOS transistor 115m is initially run through by a current lower than the steady-state one, equal to the cell current Im, since, at the end of the pre-charge/equalization phase, at the load node LOADs there are current contributions provided by the reference branches. For the balance of the currents at the node LOADs, when the equalizing transistors 125r1–125r3 are turned off, the voltage of the load node LOADs, coinciding with the voltage of the gate of the PMOS transistors 115m and 115r1, tends immediately to decrease.

Also the PMOS transistor 115r1 is initially run through by a current lower than the steady-state one, which is equal to the reference current Ir1, and, moreover, the voltage at its gate terminal is determined by the decreasing of the voltage at the node LOADs. In response to the greater current request, the voltage at the load node LOADr1 will tend first to decrease, until the gate voltage of the PMOS transistor 115r1 is not sufficiently decreased, then to increase again, in a second time, up to the correct steady-state value.

On the contrary, the voltage of the load node LOADr3 tends to rapidly increase towards its steady-state value. Also the load node LOADr2 tends immediately to increase towards its steady-state value, although with a less rapid transient.

The above-described transient generates a "belly effect" on the curve representing the voltage at the load node LOADr1, when the currents to be discriminated are close to each other, bringing an inversion of the voltages at the load nodes, which can lead to errors in the reading operation, unless the evaluation phase is properly extended. The "belly effect" is also related to the difference between the capacitive load on the two matrix branches 105m and 105r1.

SUMMARY OF THE INVENTION

In view of these drawbacks, it is an object of the present invention to overcome the above-mentioned drawbacks and to provide an improved sense amplifier.

Another object of the present invention is to provide an improved method for sensing a current.

According to a first aspect of the present invention, there is provided a sense amplifier that includes a measure branch receiving an input current to be detected, a reference branch receiving a reference current, equalizing means, and a comparator. The equalizing means selectively equalizes a measure node of the measure branch with a reference node of the reference branch, and the comparator compares a voltage at the measure node of the measure branch with a voltage at the reference node of the reference branch. The equalizing means are such that, when activated, equalization of the measure node with the reference node is virtual and substantially does not involve a flow of current between the measure node and the reference node of the reference branch. The sense amplifier is particularly suited for reading memory cells of a semiconductor memory.

According to a second aspect of the present invention, there is provided a method for sensing an input current during a sensing operation. According to the method, the input current is received at a measure node of a measure branch, and a reference current is received at a reference node of a reference branch. A first voltage at the measure node is equalized with a second voltage at the reference node in a first phase of the sensing operation. A third voltage at the measure node and a fourth voltage at the reference node are compared in a second phase of the sensing operation, with the third voltage being generated by the input current and the fourth voltage being generated by the reference current. The equalizing step is virtual and is performed in a substantial absence of current flow between the measure node and the reference node.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 4:
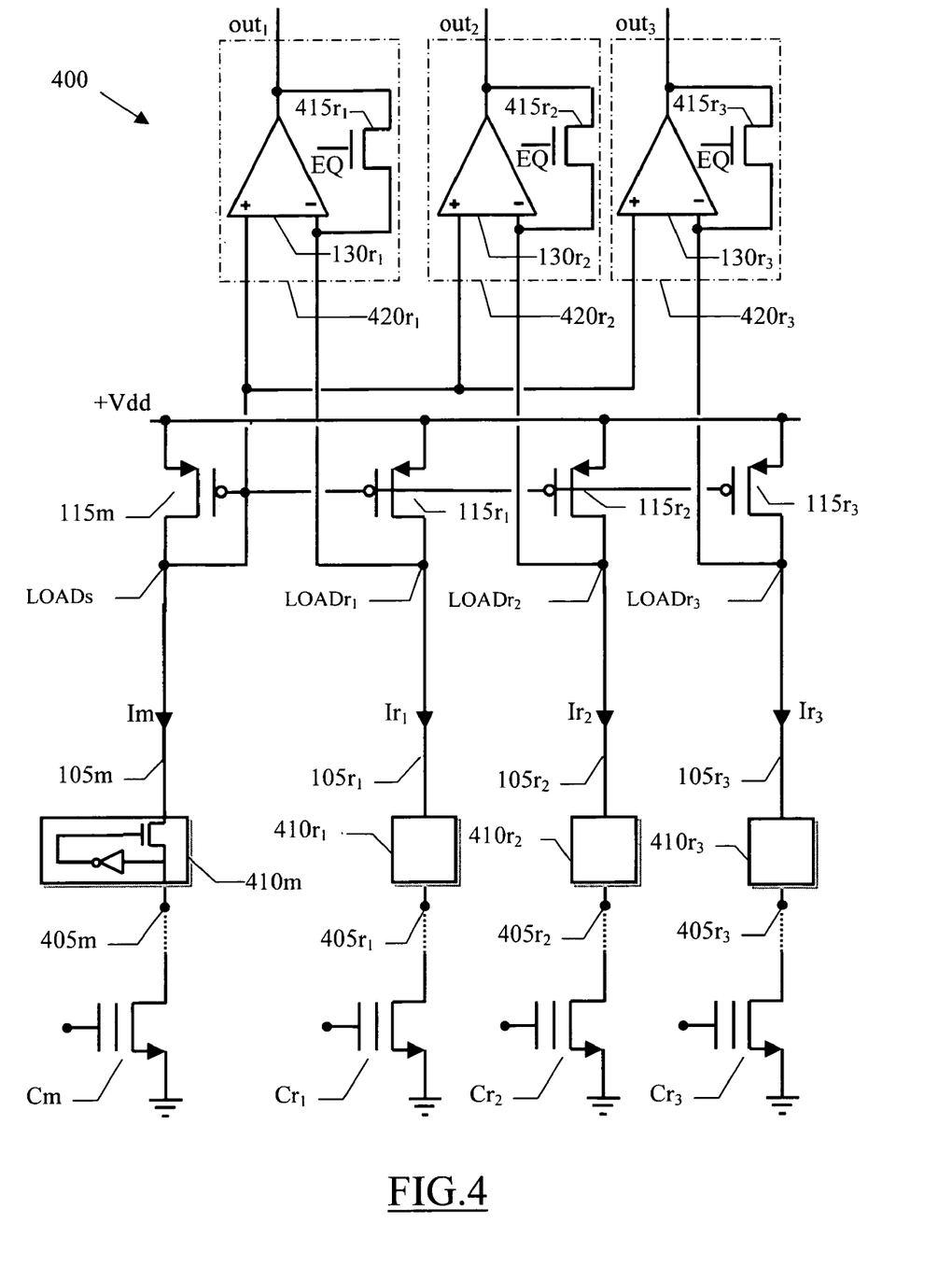
FIG. 4 is a schematic of a sense amplifier according to a preferred embodiment of the present invention.

FIG. 4 shows a schematic of a parallel sense amplifier 400 according to a preferred embodiment of the present invention. (In FIG. 4, the elements corresponding to those of the sense amplifier of FIG. 1 are denoted with the same reference numerals and their description is omitted for the sake of simplicity.)

The sense amplifier 400 is included in a semiconductor non-volatile multilevel memory device (for example, an EPROM, an EEPROM or a Flash memory, in particular of asynchronous type). In general, a semiconductor memory device includes a bi-dimensional arrangement of memory cells, corresponding to a matrix organized in a plurality of rows and a plurality of columns. The memory cells of each row are controlled by a word line, whereas the memory cells of each column are controlled by a bit line. For accessing the memory cells, these have to be properly selected by address decoding circuits. In particular, the selection of a cell is performed by selecting a word line and a bit line.

The parallel sense amplifier 400 includes a measure branch 105*m*, which receives a cell current Im at its input node 405*m*, which is connected to the bit line which includes the cell to be read. In the example shown, for the sake of simplicity, the memory cells are quadri-level and the sense amplifier 400 includes three reference branches 105*r*1–105*r*3, which receive corresponding reference currents Ir1–Ir3 at their input nodes 405*r*1–405*r*3.

The memory device includes reference cells programmed in predetermined states, for delivering reference currents Iri, where i is an index that can take the values $1, \ldots, n-1$, given a number n of levels of the memory cell. The cell current Im is read by the sense amplifier, which compares it with the reference currents Ir1–Ir3 in order to decode the corresponding logic level.

In FIG. 4, a selected memory cell Cm and three reference cells Cr1–Cr3 are shown as if they are connected directly to the measure branch 105*m* and to the corresponding reference branches 105*r*1–105*r*3, respectively (omitting, for the sake of simplicity, further circuit elements of the memory device, such as, for example, the bit line selection circuits).

Each memory and reference cell Cm and Cr1–Cr3 has its respective drain terminal connected to the respective input node 405*m* and 405*r*1–405*r*3 of the sense amplifier 100 and its respective source terminal kept at a reference voltage (or ground). Each input node 405*m* and 405*r*1–405*r*3 is then connected directly to the bit line corresponding to the respective memory and reference cells. The control gate terminals of all the cells Cm and Cr1–Cr3, connected to the corresponding word line, receive a reading voltage Vread that is equal to a supply voltage +Vdd of the memory device if sufficiently high (e.g., 5V with respect to ground), or to a bootstrapped voltage generated starting from the +Vdd.

A decoupling block 410*m* and 410*r*1–410*r*3 is connected in series between each load node LOADs and LOADr1–LOADr3 and the input terminal 405*m* and 405*r*1–405*r*3 of the corresponding branch 105*m* and 105*r*1–105*r*3. The decoupling block 410*m* and 410*r*1–410*r*3 is used for rapidly bringing the voltage at the drain terminal of the corresponding cell Cm and Cr1–Cr3 towards the correct biasing value (for example, 1V) and decoupling the load nodes LOADs and LOADr1–LOADr3 from the input terminals 405*m* and 405*r*1–405*r*3 (the input terminals 405*m* and 405*r*1–405*r*3 "see" high capacitive loads by being connected to the bit line). Typically, the decoupling block 410*m* and 410*r*1–410*r*3 includes, for example, an NMOS transistor acting as pass transistor in Cascode configuration controlled by an inverter.

Equalizing NMOS transistors 415*r*1–415*r*3 are used, in place of the equalizing NMOS transistors 125*r*1–125*r*3 of FIG. 1, for implementing a buffer 420*r*1–420*r*3 with the respective comparator 130*r*1–130*r*3. In detail, the equalizing transistor 415*r*1–415*r*3 is feedback-connected to the respective comparator 130*r*1–130*r*3 between the inverting input terminal and the output terminal.

Figure 5:
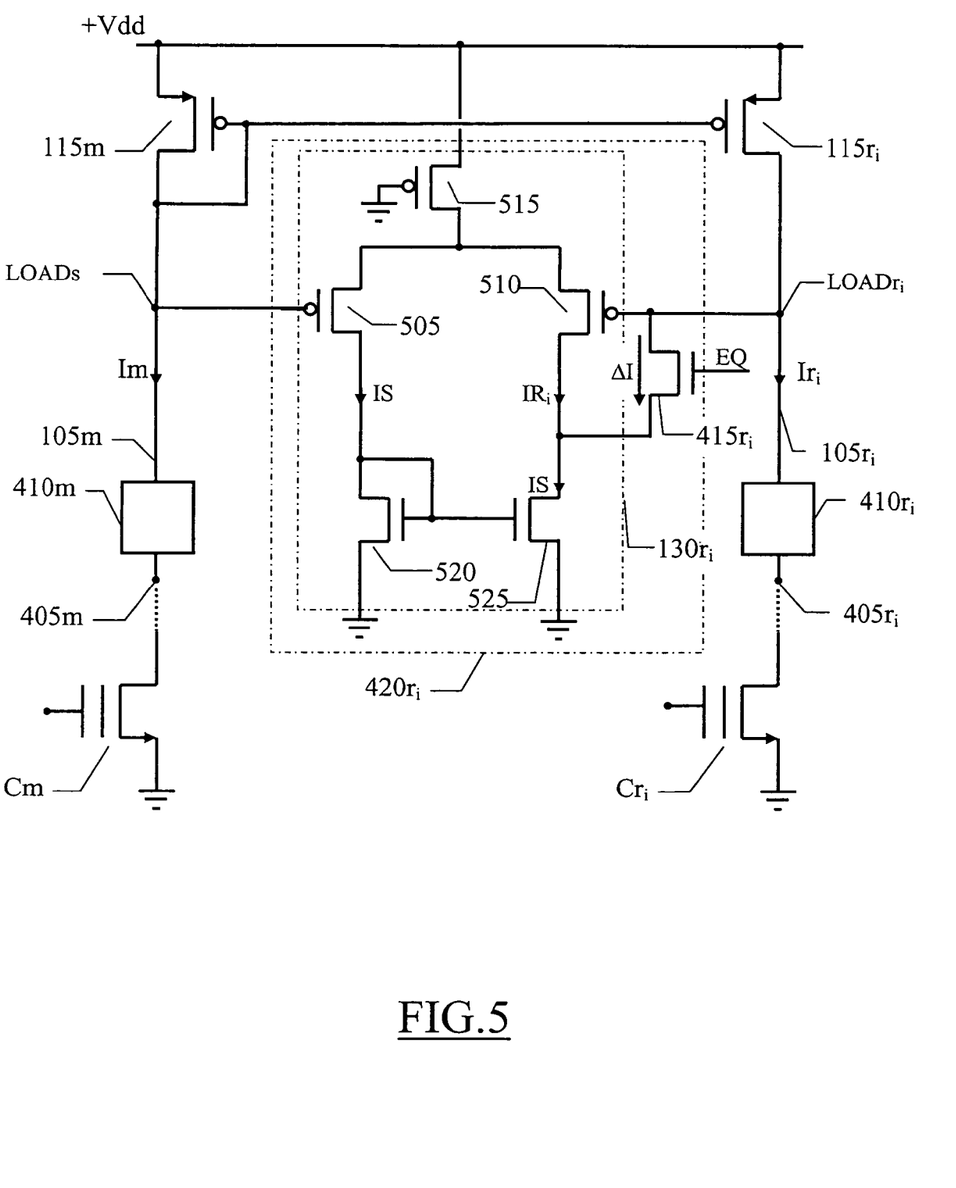
FIG. 5 shows in more detail an exemplary embodiment of a comparator in buffer configuration for use in the sense amplifier of FIG. 4.

FIG. 5 shows in detail a schematic of the comparator 130*ri* in an exemplary embodiment of the present invention. (The elements corresponding to those in FIG. 1 and FIG. 4 are denoted with the same reference numerals, and their description is omitted for the sake of simplicity.)

The non-inverting and inverting input terminals of the comparator 130*ri* coincide with the gate terminals of two PMOS transistors 505 and 510 that are connected to the load nodes LOADs and LOADri, respectively. The source terminals of the two PMOS transistors 505 and 510 are both connected to the drain terminal of a further PMOS transistor 515, whose gate terminal is kept at a reference voltage (or ground) and whose source terminal is kept at the supply voltage +Vdd. The PMOS transistor 515 in this configuration acts as a current generator. The drain terminals of the PMOS transistors 505 and 510 are connected to the drain terminals of NMOS transistors 520 and 525, respectively, where the NMOS transistor 520 is in diode configuration (i.e., with its drain and gate terminals short-circuited to each other). The gate terminals of the NMOS transistors 520 and 525 are connected together and the source terminals are kept at a reference voltage (or ground). The above-described architecture of the comparator 130$ri$ forms a differential stage with a current mirror formed by the NMOS transistors 520 and 525.

The equalizing transistor 415$ri$ has its drain terminal connected to the load node LOADri and to the gate terminal of the PMOS transistor 510, whereas its source terminal is connected to the drain terminal of the NMOS transistor 525.

When the equalization signal EQ at the gate terminal of the equalizing transistor 415$ri$ is asserted, the feedback branch of the buffer 420$ri$ closes and, if the gain of the comparator 130$ri$ is sufficiently high, the voltage of the load node LOADri is forced to be substantially equal to the one of the load node LOADs. In other words, the load node LOADri is "virtual ground". The voltage difference to the ends of the input terminals of the comparator 130$ri$ tends to be zero and the load nodes LOADs and LOADri take the same voltage although decoupled (i.e., although not physically connected so as to permit a redistribution of the currents delivered by the PMOS transistors 115$m$ and 115$ri$ on the measure and reference branches 105$m$ and 105$ri$). This phase is referred to as "virtual equalization phase".

In the virtual equalization phase, at the steady state, being the load nodes LOADs and LOADri decoupled, the PMOS transistor 115$m$ delivers the cell current Im sunk by the memory cell Cm. Accordingly, the load node LOADs, during the pre-charge, is biased at its steady-state condition. The cell current Im is mirrored on the PMOS transistor 115$ri$ onto the reference branch 105$ri$, while the reference current Iri is drawn from the load node LOADri by the reference cell Cri.

It results from the balance of the currents at the load node LOADri that, in the feedback branch of the buffer 420$ri$, a current $\Delta I$ flows, of value equal to the difference between the cell current Im and the reference current Iri ($\Delta I$=Im Iri). The feedback branch consists of the equalizing transistor 415$ri$.

In the branch 505–520 of the comparator 130$ri$ a current IS flows, mirrored on the NMOS transistor 525, whereas, for the balance of the currents at the drain terminal of the NMOS transistor 525 (coinciding with the output terminal of the comparator 130$ri$), in the PMOS transistor 510 a current IRi flows equal to IS - $\Delta I$. The comparator 130$ri$ then self-biases in a condition in which the currents in the transistors 505 and 510 differ for the signal current (i.e., for the difference between the cell current Im and the reference current Iri).

At the beginning of the evaluation phase, when the feedback branch is open (equalization signal EQ de-asserted), the current sunk by the PMOS transistor 115$m$ is already stable at the steady-state value and equal to the cell current Im. Then the voltage at the gate terminal of the PMOS transistor 115$ri$ is already stable and, for example, in the case in which the cell current Im is greater than the reference current Iri, the voltage at the load node LOADri is free to increase to the correct steady-state value.

In addition, between the virtual equalization phase and the evaluation phase the node LOADri moves from a low-impedance condition to a high-impedance condition, obtaining a voltage gain already at the beginning of the evaluation phase. The evaluation phase can now be sped up also when the currents to be discriminated differ on the order of a few microamperes, as in the present case of a multilevel memory cell. Also the comparator 130$ri$, when the feedback branch is open, produces a rapid response, since during the virtual equalization phase it has been self-biased to its point of maximum gain.

Figure 6:
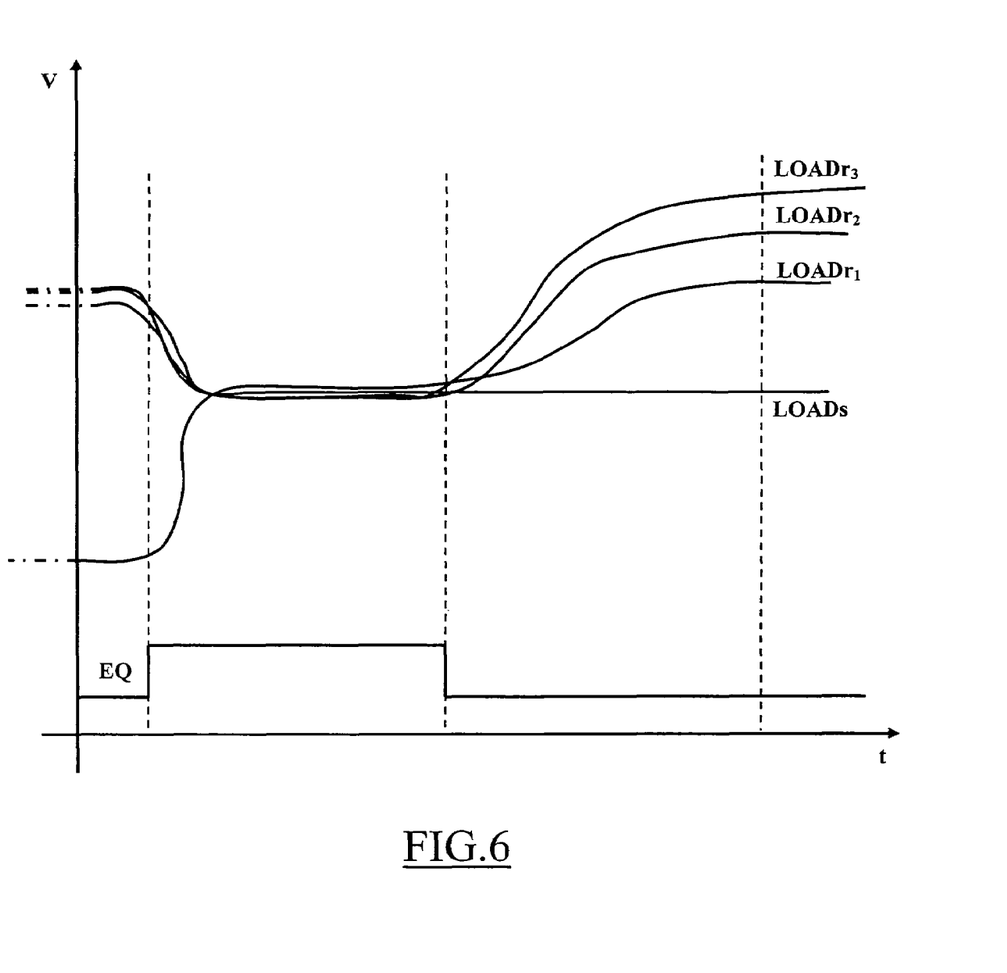
FIG. 6 shows the trend of the voltages at load nodes of the sense amplifier of FIG. 4 versus time in the case of a particular programming state of the memory cell to be read.

FIG. 6 shows the voltages at the load nodes LOADs and LOADr1–LOADr3 versus time in the parallel sense amplifier according to the preferred embodiment of the present invention, in the exemplary case of the reading of a quadri-level cell in the state 11.

During the virtual equalization phase the four voltages at the load nodes LOADs and LOADr1–LOADr3 stabilize at the steady-state value, corresponding to the voltage at the load node LOADs in the evaluation phase. Accordingly, during the evaluation phase, the voltage at the load node LOADs is kept stable, whereas the voltages at the load nodes LOADr1–LOADr3 are free to rapidly reach their corresponding steady-state value.

Naturally, in order to satisfy local and specific requirements of a particular application, a person of ordinary skill in the art can modify and alter the above-described exemplary embodiments within the scope of the present invention as defined by the claims.

For example, the concepts of the present invention apply as well when the sense amplifier includes equivalent components or when NMOS transistors are substituted for the PMOS transistors, and vice versa. Similarly, the current mirror can be implemented with a different architecture. Alternatively, the memory device can have a different architecture and analogous considerations apply if the memory cells are programmable to another number of levels (also to a number that is not a power of 2); the sense amplifier is employable in any type of semiconductor memory and, is particularly suited for any type of non-volatile memory. Further, the function of the equalizing transistor can be realized by another, active or passive, component that can be configured in order to act as a controlled switch.

Although the embodiments described above relate to the use of the sense amplifier for the reading of memory cells, the sense amplifier of the present invention can actually be used in any application that requires the sensing of a current.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A sense amplifier comprising:
   a measure branch receiving an input current to be detected;

at least one reference branch receiving a reference current;

equalizing means selectively equalizing a measure node of the measure branch with a reference node of the reference branch; and at least one comparator comparing a voltage at the measure node of the measure branch with a voltage at the reference node of the reference branch, wherein the equalizing means are such that, when activated, equalization of the measure node with the reference node is virtual and substantially does not involve a flow of current between the measure node and the reference node of the reference branch.

2. The sense amplifier according to claim 1, wherein the equalizing means includes at least one differential amplifier in negative feedback, the differential amplifier including a first input terminal that is connected to the measure node and a second input terminal that is connected to the reference node of the reference branch.

3. The sense amplifier according to claim 2, wherein the differential amplifier includes a feedback circuit path that includes switching means that selectively opens and closes the feedback circuit path.

4. The sense amplifier according to claim 3, wherein the switching means includes at least one transistor having a first terminal connected to the reference node, a second terminal connected to an output terminal of the differential amplifier and a control terminal receiving an equalization signal that controls the opening and closing of the feedback circuit path.

5. The sense amplifier according to claim 2, wherein the equalizing means includes the at least one comparator.

6. The sense amplifier according to claim 5, wherein the feedback circuit path is associated with the comparator, and the comparator acts as the differential amplifier of the equalizing means when the feedback circuit path is closed.

7. The sense amplifier according to claim 1, wherein the comparator comprises a current mirror coupled to the measure node and the reference node for mirroring the input current on the reference branch.

8. The sense amplifier according to claim 1, wherein the at least one reference branch includes at least two reference branches, each of the references branches receiving a corresponding reference current.

9. The sense amplifier according to claim 8, wherein the equalizing means includes a plurality of differential amplifiers in negative feedback, each of the differential amplifiers being associated with one of the reference branches.

10. A memory device comprising:
at least one memory cell; and
a sense amplifier sensing a current sunk by the memory cell, the sense amplifier including:
a measure branch receiving an input current to be detected;
at least one reference branch receiving a reference current;
equalizing means selectively equalizing a measure node of the measure branch with a reference node of the reference branch; and
at least one comparator comparing a voltage at the measure node of the measure branch with a voltage at the reference node of the reference branch,
wherein the equalizing means are such that, when activated, equalization of the measure node with the reference node is virtual and substantially does not involve a flow of current between the measure node and the reference node of the reference branch.

11. The memory device according to claim 10, further comprising at least one reference cell generating the reference current.

12. The memory device according to claim 10, wherein the memory cell is a multilevel memory cell that stores a logic value including more than one bit.

13. The memory device according to claim 10, wherein the equalizing means of the sense amplifier includes at least one differential amplifier in negative feedback, the differential amplifier including a first input terminal that is connected to the measure node and a second input terminal that is connected to the reference node of the reference branch.

14. The memory device according to claim 10, wherein the equalizing means of the sense amplifier includes the at least one comparator.

15. The memory device according to claim 10, wherein the comparator of the sense amplifier comprises a current mirror coupled to the measure node and the reference node for mirroring the input current on the reference branch.

16. The memory device according to claim 10, wherein the at least one reference branch of the sense amplifier includes at least two reference branches, each of the references branches receiving a corresponding reference current.

17. A method for sensing an input current during a sensing operation, said method including the steps of:
receiving the input current at a measure node of a measure branch;
receiving at least one reference current at a reference node of at least one reference branch;
equalizing a first voltage at the measure node with a second voltage at the reference node in a first phase of the sensing operation; and
comparing a third voltage at the measure node and a fourth voltage at the reference node in a second phase of the sensing operation, the third voltage being generated by the input current and the fourth voltage being generated by the reference current,
wherein the equalizing step is virtual and is performed in a substantial absence of current flow between the measure node and the reference node.

18. The method according to claim 17, wherein the equalizing step includes the sub-step of using a differential amplifier with negative feedback to equalize the first voltage with the second voltage.

19. The method according to claim 18, wherein the comparing step includes the sub-step of using a comparator to compare the third voltage with the fourth voltage.

20. The method according to claim 19,
wherein the equalizing step includes closing a negative feedback circuit path of the differential amplifier to cause the differential amplifier to perform the equalizing, and
the comparing step includes opening the negative feedback circuit path of the differential amplifier to cause the differential amplifier to operate as the comparator for performing the comparing.

21. A method of reading a memory cell, said method comprising the steps of:
supplying a cell current sunk by the memory cell as an input current to a measure branch; and
sensing the input current using the method for sensing an input current according to claim 17.

* * * * *